(12) United States Patent
Xie et al.

(10) Patent No.: US 11,757,036 B2
(45) Date of Patent: Sep. 12, 2023

(54) MOON-SHAPED BOTTOM SPACER FOR VERTICAL TRANSPORT FIELD EFFECT TRANSISTOR (VTFET) DEVICES

(71) Applicant: International Business Machines Corporation, Armonk, NY (US)

(72) Inventors: Ruilong Xie, Niskayuna, NY (US); Chen Zhang, Guilderland, NY (US); Julien Frougier, Albany, NY (US); Alexander Reznicek, Troy, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 17/388,572

(22) Filed: Jul. 29, 2021

(65) Prior Publication Data
US 2023/0031574 A1 Feb. 2, 2023

(51) Int. Cl.
*H01L 29/78* (2006.01)
*H01L 29/417* (2006.01)
*H01L 29/66* (2006.01)

(52) U.S. Cl.
CPC .... *H01L 29/7827* (2013.01); *H01L 29/41741* (2013.01); *H01L 29/41766* (2013.01); *H01L 29/6653* (2013.01); *H01L 29/66666* (2013.01)

(58) Field of Classification Search
CPC .......... H01L 29/7827; H01L 29/41741; H01L 29/41766; H01L 29/6653; H01L 29/66666
USPC .......................................................... 257/329
See application file for complete search history.

(56) References Cited

U.S. PATENT DOCUMENTS

| | | | |
|---|---|---|---|
| 9,530,863 B1 | 12/2016 | Zhang et al. | |
| 9,530,866 B1 | 12/2016 | Zhang et al. | |
| 9,716,170 B1 | 7/2017 | Cheng et al. | |
| 9,741,626 B1 | 8/2017 | Cheng et al. | |
| 9,780,208 B1 | 10/2017 | Xie et al. | |
| 9,799,749 B1 | 10/2017 | Bi et al. | |
| 9,859,166 B1 | 1/2018 | Cheng et al. | |
| 10,096,692 B1 | 10/2018 | Cheng et al. | |
| 10,157,798 B1* | 12/2018 | Chi | H01L 21/823487 |
| 10,276,687 B1 | 4/2019 | Bao et al. | |
| 10,672,887 B2 | 6/2020 | Wang et al. | |
| 10,957,781 B2 | 3/2021 | Belyansky et al. | |
| 2017/0229558 A1* | 8/2017 | Anderson | H01L 21/84 |
| 2017/0358497 A1* | 12/2017 | Cheng | H01L 29/0649 |

* cited by examiner

*Primary Examiner* — Mohammad M Hoque
(74) *Attorney, Agent, or Firm* — Scully, Scott, Murphy & Presser, P.C.; Jeffrey Kelly, Esq.

(57) ABSTRACT

A uniform moon-shaped bottom spacer for a VTFET device is provided utilizing a replacement bottom spacer that is epitaxially grown above a bottom source/drain region. After filling a trench that is formed into a substrate with a dielectric fill material that also covers the replacement bottom spacer, the replacement bottom spacer is accessed, removed and then replaced with a moon-shaped bottom spacer.

14 Claims, 10 Drawing Sheets

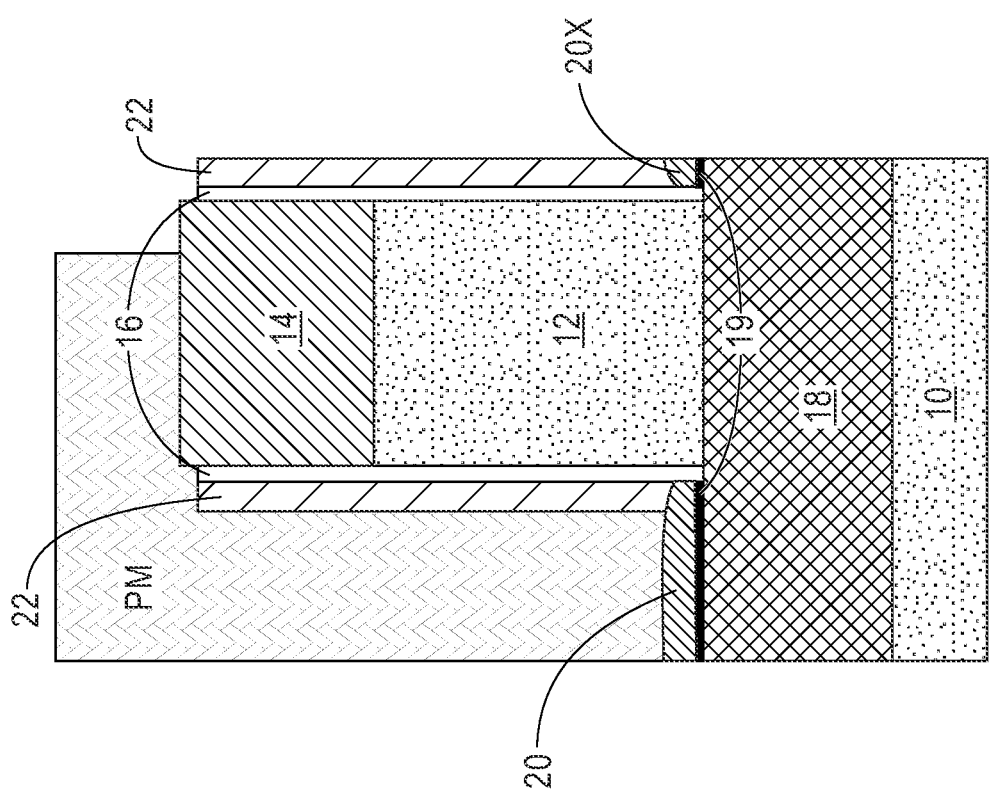
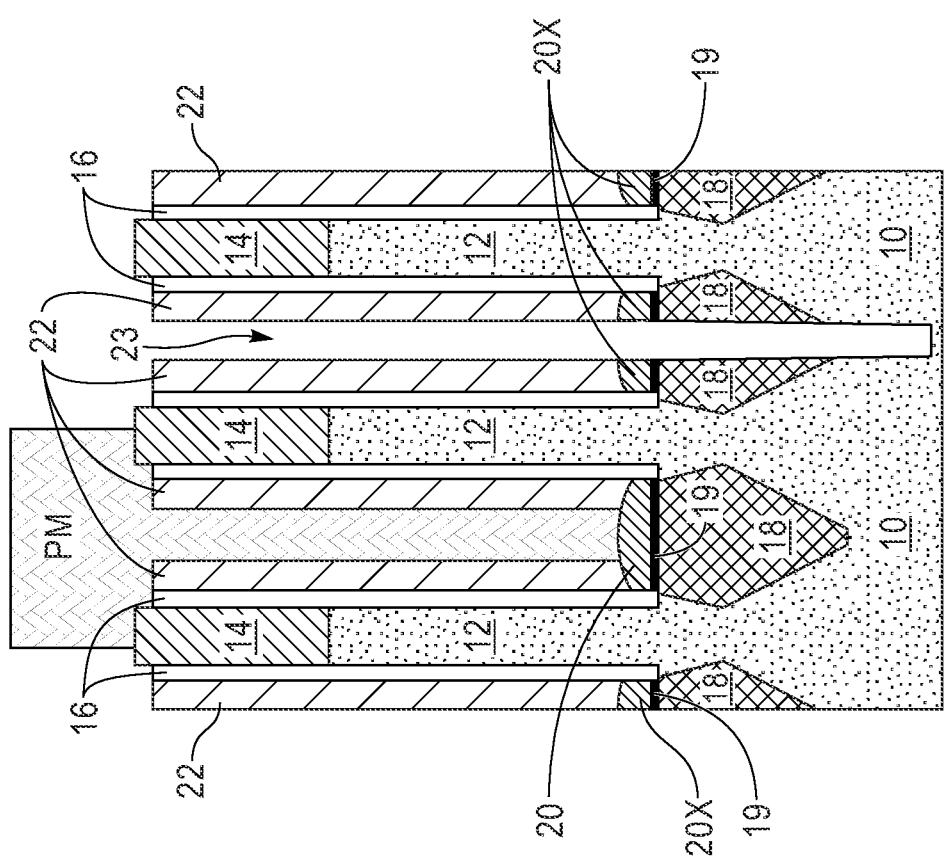
FIG. 4A
FIG. 4B

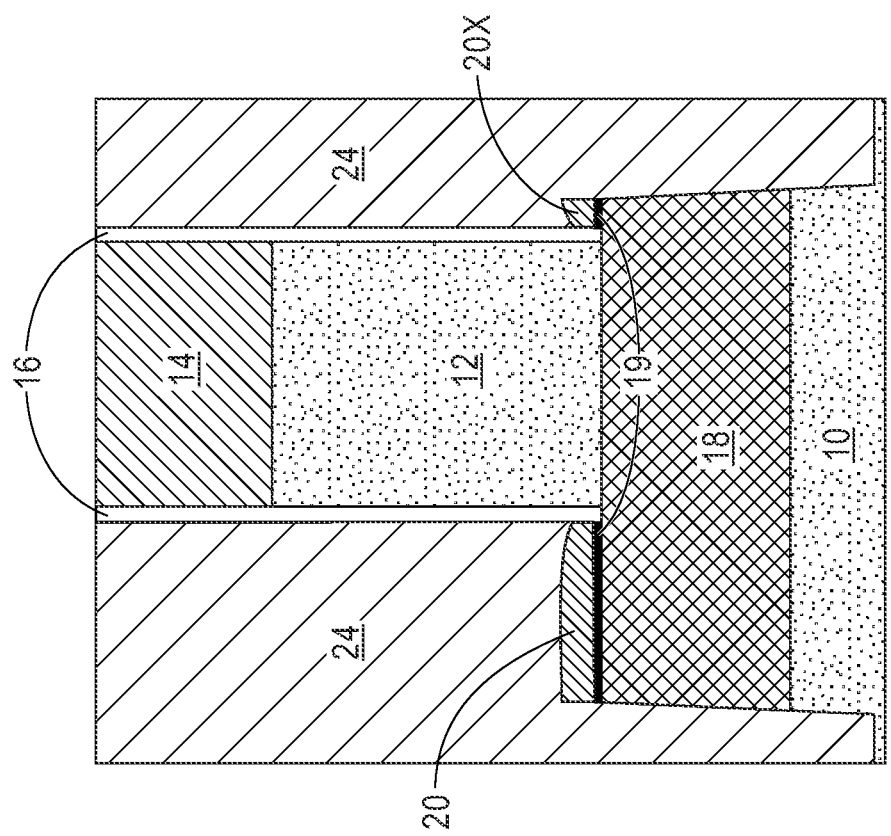
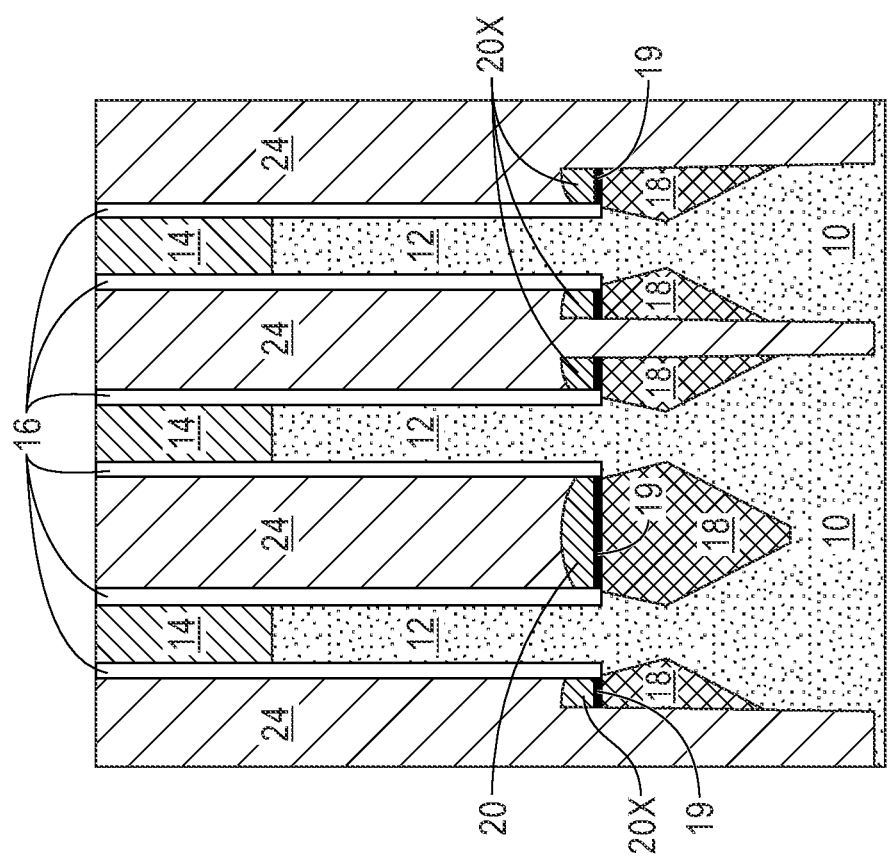
FIG. 5A
FIG. 5B

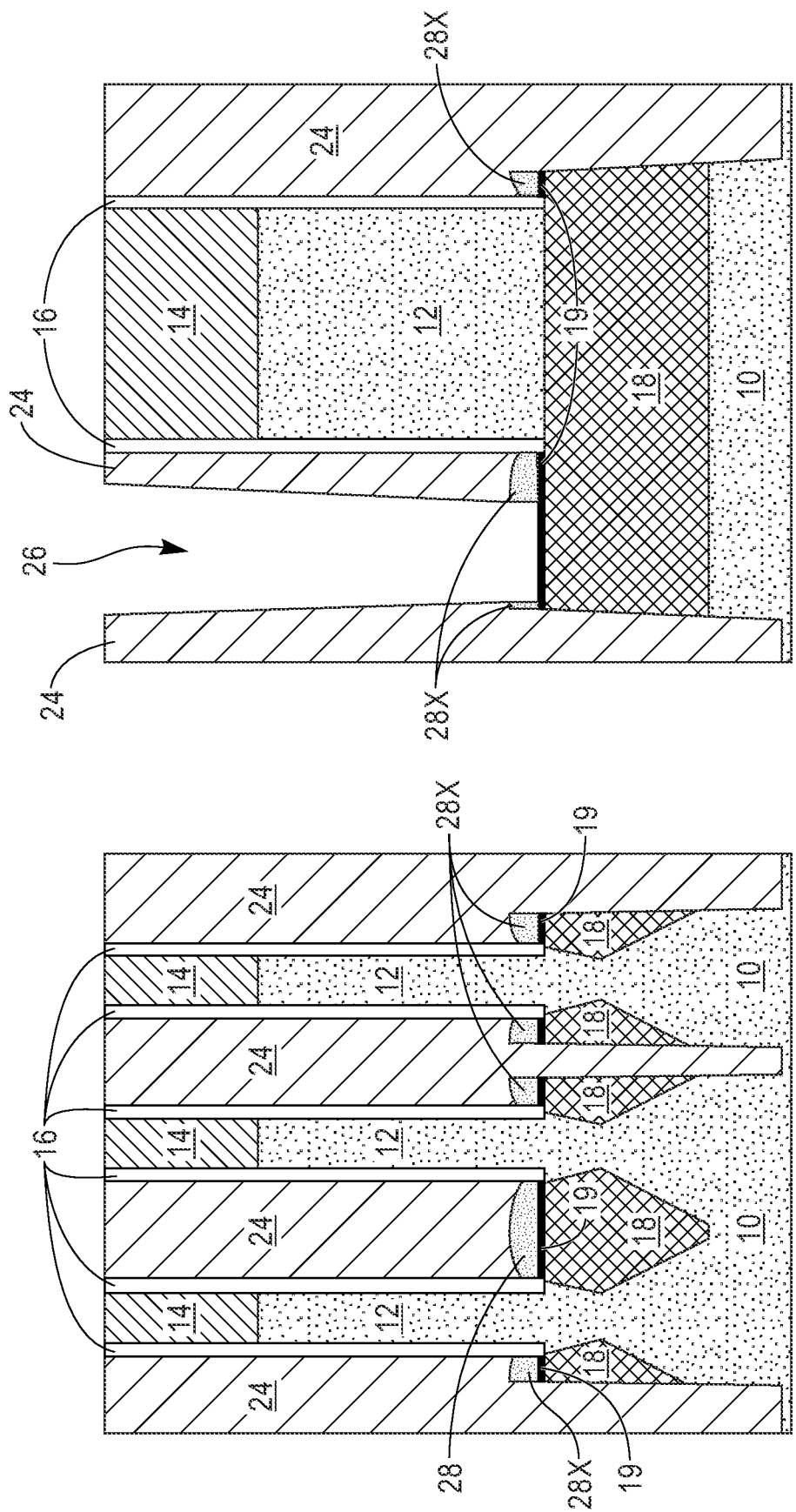

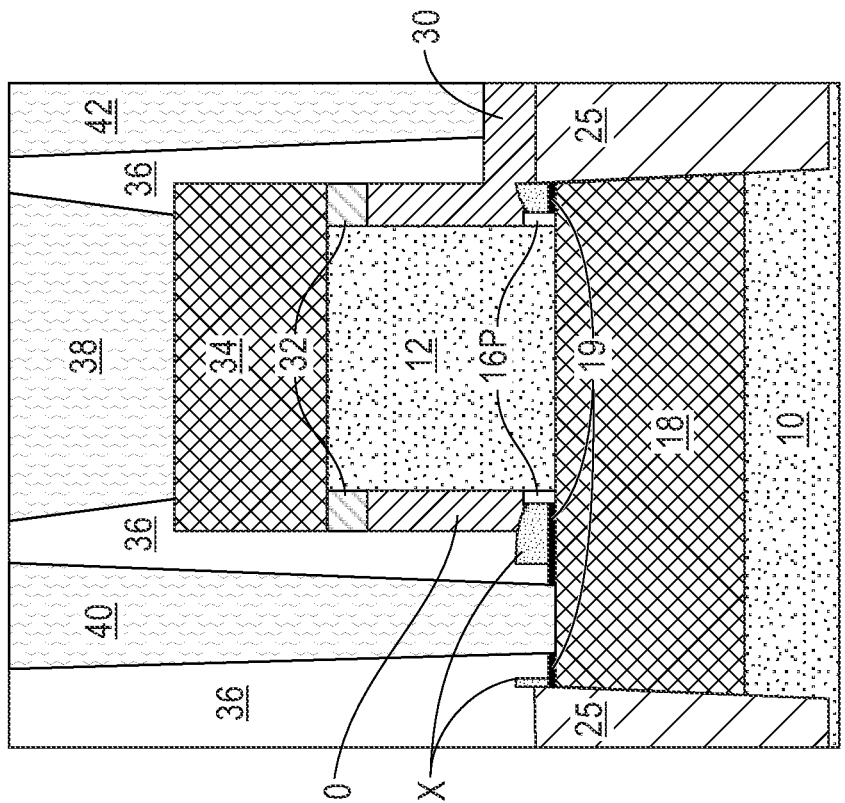
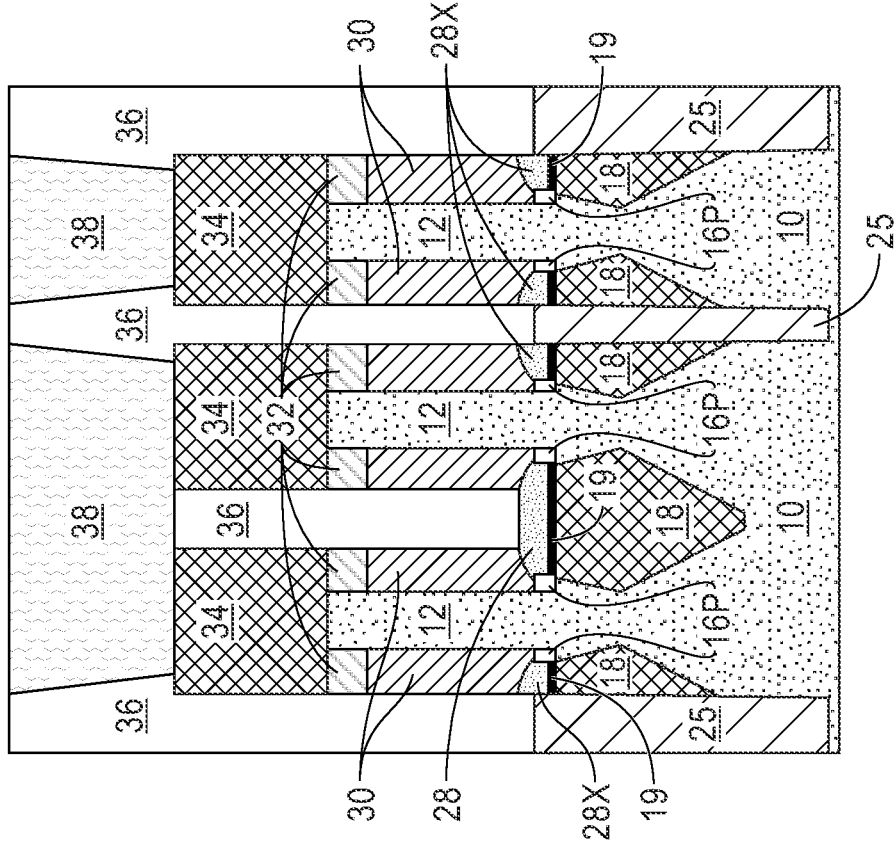
FIG. 11A
FIG. 11B

MOON-SHAPED BOTTOM SPACER FOR VERTICAL TRANSPORT FIELD EFFECT TRANSISTOR (VTFET) DEVICES

BACKGROUND

The present application relates to semiconductor technology, and more particularly to a vertical transport field effect transistor (VTFET) device including a moon-shaped bottom spacer.

Conventional VTFETs are devices where the source-drain current flows in a direction normal to the substrate surface. In such devices, a vertical semiconductor pillar (or fin) defines the channel with the source and drain located at opposing ends of the semiconductor pillar (or fin). VTFETs are an attractive option for technology scaling for beyond 7 nm technologies, and have potential advantages over conventional FINFETs in terms of density, performance, power consumption and integration. In conventional VTFETs, bottom spacers are typically formed utilizing a directional dielectric deposition process (such as high density plasma deposition). Bottom spacers formed by such a deposition process have a high variation in thickness. The formation of bottom spacers that have a uniform thickness is challenging, and is needed to improve the performance of the VTFETs.

SUMMARY

A uniform moon-shaped bottom spacer for a VTFET device is provided utilizing a replacement bottom spacer that is epitaxially grown above a bottom source/drain region. After filling a trench that is formed into a substrate with a dielectric fill material that also covers the replacement bottom spacer, the replacement bottom spacer is accessed, removed and then replaced with a moon-shaped bottom spacer.

In one aspect of the present application, a VTFET device is provided. In one embodiment, the VTFET device includes at least one semiconductor fin extending upward from a substrate and located in a first active device region, wherein a trench isolation structure is located in the substrate and at the edge of the first active device region. A bottom source/drain region is located beneath, and on each side of, the at least one semiconductor fin. A moon-shaped bottom spacer is located laterally adjacent to a lower portion of at least a first side of the at least one semiconductor fin and above the bottom source/drain region. A functional gate structure contacts a middle portion of the at least one semiconductor fin and is located on a surface of the moon-shaped bottom spacer. A top spacer contacts an upper portion of the at least one semiconductor fin and is located on a surface of the functional gate structure. A top source/drain region contacts an upper surface of the at least one semiconductor fin.

In another aspect of the present application, a method of forming a VTFET device is provided. In one embodiment, the method includes forming a structure including at least one semiconductor fin extending upwards from a surface of a substrate, a sacrificial hard mask cap located on the at least one semiconductor fin, a sacrificial spacer lining a sidewall of the at least one semiconductor fin, and a bottom source/drain region located beneath, and on each side of, the at least one semiconductor fin. Next, a replacement bottom spacer is formed above the bottom source/drain region. A trench is then formed in the substrate to define an active device region containing the structure and the replacement bottom spacer, and thereafter a dielectric fill material is formed laterally adjacent to the at least one semiconductor fin and within the trench. After forming the dielectric fill material, the replacement bottom spacer is replaced with a moon-shaped bottom spacer.

BRIEF DESCRIPTION OF THE DRAWINGS

FIG. 4A is a cross sectional view of the exemplary structure of FIG. 3A after forming a dielectric spacer laterally adjacent to the sacrificial dielectric spacer, forming a patterned mask covering at least one active device region, and forming a trench into a portion of the substrate.

FIG. 4B is a cross sectional view of the exemplary structure of FIG. 3B after forming a dielectric spacer laterally adjacent to the sacrificial dielectric spacer, forming a patterned mask covering at least one active device region, and forming a trench into a portion of the substrate.

FIG. 5A is a cross sectional view of the exemplary structure of FIG. 4A after removing the patterned mask and forming a dielectric fill material between each semiconductor fin and within the trench.

FIG. 5B is a cross sectional view of the exemplary structure of FIG. 4B after removing the patterned mask and forming a dielectric fill material between each semiconductor fin and within the trench.

FIG. 9A is a cross sectional view of the exemplary structure of FIG. 8A after performing a spacer dielectric etch back process to provide a bottom spacer that is moon-shaped in each of the voids.

FIG. 9B is a cross sectional view of the exemplary structure of FIG. 8B after performing a spacer dielectric etch back process to provide a bottom spacer that is moon-shaped in each of the voids.

FIG. 11A is a cross sectional view of the exemplary structure of FIG. 10A after forming a functional gate structure, a top spacer, a top source/drain region, an interlayer dielectric (ILD) material layer, and contact structures.

FIG. 11B is a cross sectional view of the exemplary structure of FIG. 10B after forming a functional gate structure, a top spacer, a top source/drain region, an interlayer dielectric (ILD) material layer, and contact structures.

DETAILED DESCRIPTION

Figure 1:
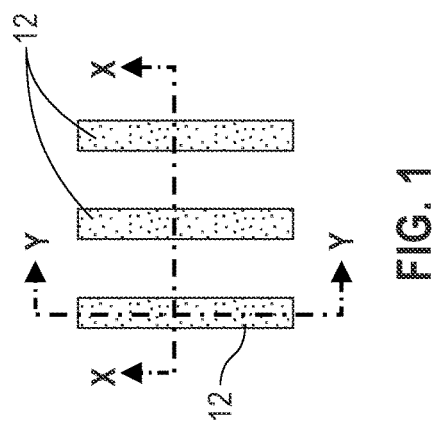
FIG. 1 is a diagram showing three parallel orientated semiconductor fins including X-X which cuts through each of the semiconductor fins, and Y-Y which is along a length wise direction of one of the semiconductor fins.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is provided a diagram showing three parallel orientated semiconductor fins 12 including X-X which cuts through each of the semiconductor fins 12, and Y-Y which is along a length wise direction of one of the semiconductor fins 12. These X-X and Y-Y cuts will be used in the remaining drawings (i.e., FIGS. 2A-11B) of the present application. Notably, each of FIGS. 2A, 3A, 4A, 5A, 6A, 7A, 8A, 9A, 10A and 11A is a cross sectional view through X-X in FIG. 1, and each of are each of FIGS. 2B, 3B, 4B, 5B, 6B, 7B, 8B, 9B, 10B and 11B is a cross sectional view through Y-Y in FIG. 1. It is noted that the term "semiconductor fin" is used herein to describe any vertical channel semiconductor structure such as, for example, a semiconductor pillar.

Figure 2A:
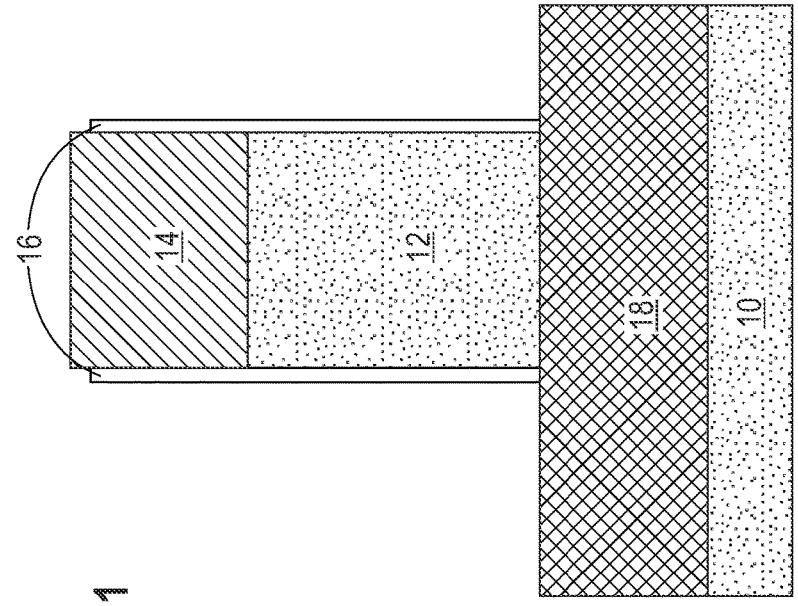
FIG. 2A is a cross sectional view of an exemplary structure that can be employed in accordance with an embodiment of the present application and through X-X shown in FIG. 1, the exemplary structure including a plurality of semiconductor fins extending upwards from a surface of a substrate, a sacrificial hard mask cap located on each semiconductor fin, a sacrificial spacer lining a sidewall of each semiconductor fin, and a bottom source/drain region located beneath, and on each side of, the semiconductor fins.
Figure 2B:
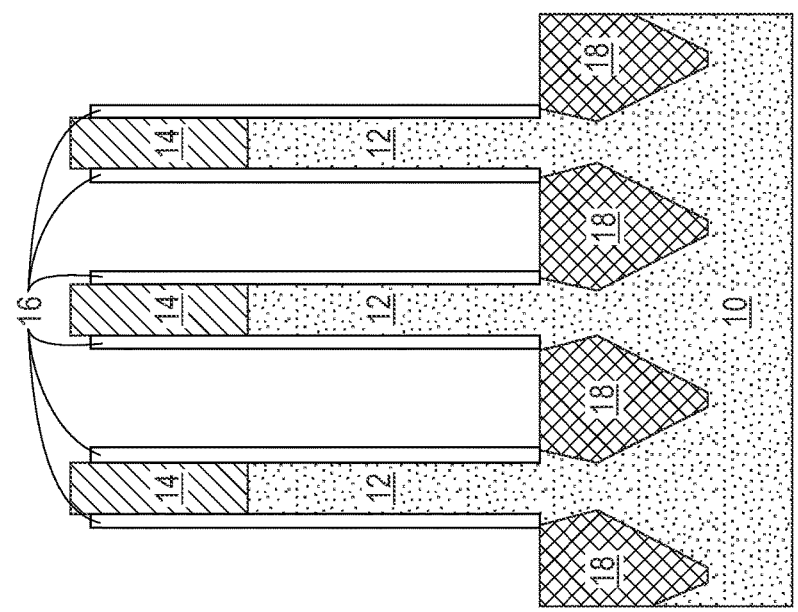
FIG. 2B is a cross sectional view of an exemplary structure that can be employed in accordance with an embodiment of the present application and through Y-Y shown in FIG. 1, the exemplary structure including a plurality of semiconductor fins extending upwards from a surface of a substrate, a sacrificial hard mask cap located on each semiconductor fin, a sacrificial spacer lining the a sidewall of each semiconductor fin, and a bottom source/drain region located beneath, and on each side of, the semiconductor fins.

Referring now to FIGS. 2A-2B, there are shown an exemplary structure that can be employed in accordance with an embodiment of the present application. Notably, the exemplary structure of FIGS. 2A-2B includes a plurality of semiconductor fins 12 extending upwards from a surface of a substrate 10, a sacrificial hard mask cap 14 located on each semiconductor fin 12, a sacrificial spacer 16 lining a sidewall of each semiconductor fin 12, and a bottom source/drain region 18 located beneath, and on each side of, the semiconductor fins 12. As is shown, the sacrificial spacer 16 lines a sidewall of each sacrificial hard mask cap 14. It should be noted that in the present application, three semiconductor fins 12 are shown by way of one example. The present application is not however limited to three semiconductor fins, but instead can be used with only a single semiconductor fin, two semiconductor fins, or more than three semiconductor fins.

The exemplary semiconductor structure shown in FIGS. 2A-2B can be formed utilizing various processing techniques that are well known to those skilled in the art. For example, semiconductor fins 12 and the sacrificial hard mask caps 14 can be formed by depositing a blanket layer of dielectric hard mask material on an upper semiconductor material portion of a substrate, and then patterning the blanket layer of dielectric hard mask material and the upper semiconductor material portion of the substrate by lithography and etching. The sacrificial spacer 16 can be formed by depositing a layer of dielectric spacer material on physically exposed surfaces of the semiconductor fins 12, the sacrificial hard mask caps 14, and then performing a spacer etch to remove the layer of dielectric spacer material from all horizontal surfaces, while maintaining the layer of dielectric spacer material along a sidewall of the semiconductor fins 12 and the sacrificial hard mask caps 14; the maintained portion of the layer of dielectric spacer material provides the sacrificial spacer 16 shown in FIGS. 2A-2B. The bottom source/drain regions 18 can be formed by forming a trench in the substrate and at the footprint of each semiconductor fin 12, and thereafter the trench is filled with a semiconductor material utilizing an epitaxial growth process. In some embodiments, dopants can be added during the epitaxial growth of the semiconductor material, while in other embodiments, dopants are added after the epitaxial growth of the semiconductor material. In some embodiments, and following doping of the semiconductor material, a drive in anneal can be employed to form the bottom source/drain regions 18. Other techniques besides those mentioned hereinabove can also be used in forming the exemplary structure shown in FIGS. 2A-2B. For example, the semiconductor fins 12 can be formed utilizing a sidewall image transfer process or a direct self-assembly process.

In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth can be performed at a temperature of from 300° C. to 800° C. The epitaxial growth can be performed utilizing any well-known precursor gas or gas mixture. Carrier gases like hydrogen, nitrogen, helium and argon can be used. A dopant (n-type or p-type, as defined below) is typically added to the precursor gas or gas mixture.

In one embodiment of the present application, substrate 10 can be entirely composed of one or more semiconductor materials. Examples of semiconductor materials that can be used to provide the substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In such an embodiment, substrate 10 can be referred to a bulk semiconductor substrate.

In another embodiment of the present application, substrate 10 can be composed of a multilayered stack of from bottom to top, a semiconductor material layer, and an insulator material layer. In such an embodiment, the semiconductor material layer can be composed of at least one of the semiconductor materials mentioned above, and the insulator material layer can be composed of a dielectric material such as, for example, silicon oxide, and/or boron nitride.

In yet another embodiment, substrate 10 is composed entirely of a dielectric material such as, for example, silicon oxide, silicon nitride, or silicon oxynitride.

The semiconductor fins 12 (or other vertical semiconductor channel structures) are composed of one of the semiconductor materials mentioned above for substrate 10. The semiconductor material that provides the semiconductor fins 12 can be compositionally the same as, or compositionally different from, at least an uppermost semiconductor material portion of substrate 10. In some embodiments, each semiconductor fin 12 is composed of a compositionally same semiconductor material. In other embodiments, some of the semiconductor fins 12 (e.g., for the first two shown in the left hand side of FIG. 2A) are composed of a first semiconductor material that is capable of providing high channel mobility for NFET devices, while the other semiconductor fin 12 (e.g., the last semiconductor fin shown in the right hand side of FIG. 2A) is a composed of a second semiconductor material that is compositionally different from the first semiconductor material and is capable of providing high channel mobility for PFET devices. In embodiments, in which the semiconductor fins 12 are composed of a different semiconductor material than at least the upper portion of substrate 10, a material interface (not shown) can exist between the substrate 10 and each semiconductor fin 12.

Each semiconductor fin 12 is oriented parallel to each other. Each semiconductor fin 12 typically has a same height and width. In one example, each semiconductor fin 12 has a height as measured from a topmost surface of the substrate 10 to the topmost surface of the semiconductor fin 12, of from 30 nm to 200 nm, and a width, as measured from one sidewall surface of a semiconductor fin 12 to an opposing sidewall surface of the same semiconductor fin 12, of from 5 nm to 20 nm. Other heights and widths besides those mentioned herein are contemplated and can thus be employed in the present application.

The sacrificial hard mask caps 14, which are located on a topmost surface of the semiconductor fins 12, can be composed of a dielectric hard mask material such as, for example, silicon oxide, silicon nitride, silicon oxynitride, or any suitable combination of those dielectric hard mask materials. Each sacrificial hard mask cap 14 can have a thickness from 5 nm to 50 nm, although other thicknesses for the sacrificial hard mask caps 14 are contemplated and can be used in the present application as the thickness of the sacrificial hard mask caps 14. Each sacrificial hard mask cap 14 typically has an outermost sidewall that is vertically aligned with the outermost sidewall of the underlying semiconductor fin 12.

The sacrificial spacer 16 is composed of a dielectric spacer material such as, for example, silicon oxide, silicon nitride, or silicon oxynitride. The dielectric spacer material that provides the sacrificial spacer 16 can be compositionally the same as, or compositionally different from, the dielectric hard mask material that provides the sacrificial hard mask caps 14. In some embodiments, and as is illustrated in FIGS. 2A and 2B, the sacrificial spacer 16 is pillar shaped. In some embodiments (not illustrated), the sacrificial spacer 16 can have a topmost surface that is coplanar with a topmost surface of each sacrificial hard mask cap 14. In other embodiments, and as is shown in FIGS. 2A-2B, the sacrificial spacer 16 can have a topmost surface that is non-coplanar with, and located beneath, a topmost surface of each sacrificial hard mask cap 14.

The bottom source/drain regions 18 are composed of a semiconductor material and a dopant. As used herein, a "source/drain" region can be a source region or a drain region depending on subsequent wiring and application of voltages during operation of the field effect transistor (FET). The semiconductor material that provides the bottom source/drain regions 18 can include one of the semiconductor materials mentioned above for the substrate 10. The semiconductor material that provides the bottom source/drains regions 18 can be compositionally the same as, or compositionally different from, the semiconductor material that provides each semiconductor fin 12. The dopant that is present in the bottom source/drain regions 18 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the bottom source/drain regions 18 can have a dopant concentration of from $4 \times 10^{20}$ atoms/cm$^3$ to $3 \times 10^{21}$ atoms/cm$^3$.

Figure 3A:
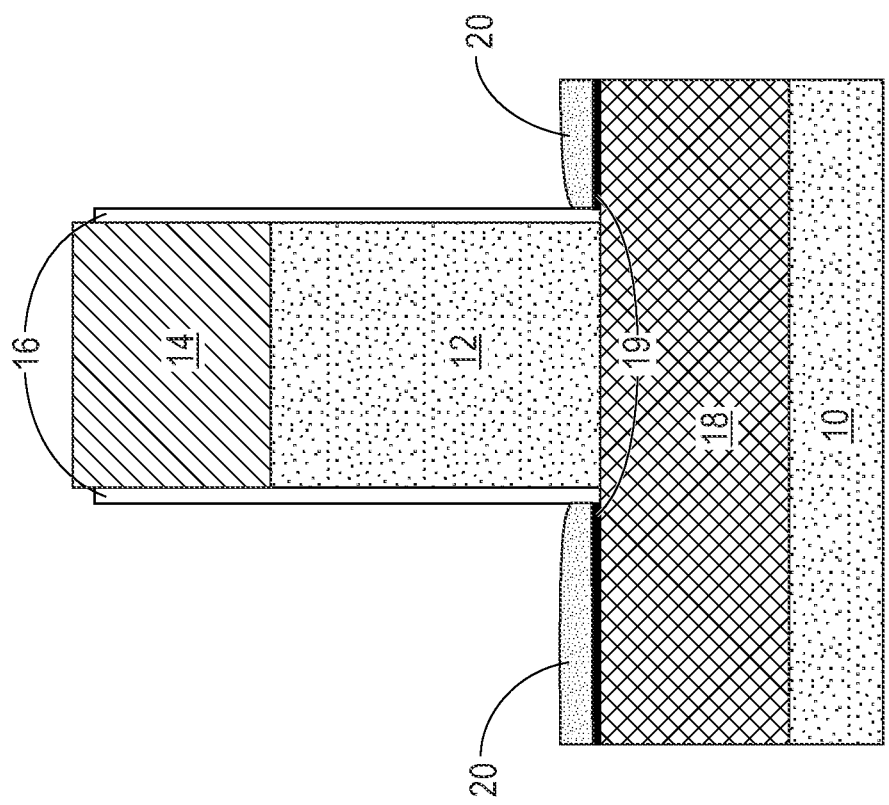
FIG. 3A is a cross sectional view of the exemplary structure of FIG. 2A after forming an optional semiconductor layer on each bottom source/drain region and forming a replacement bottom spacer on the semiconductor layer.
Figure 3B:
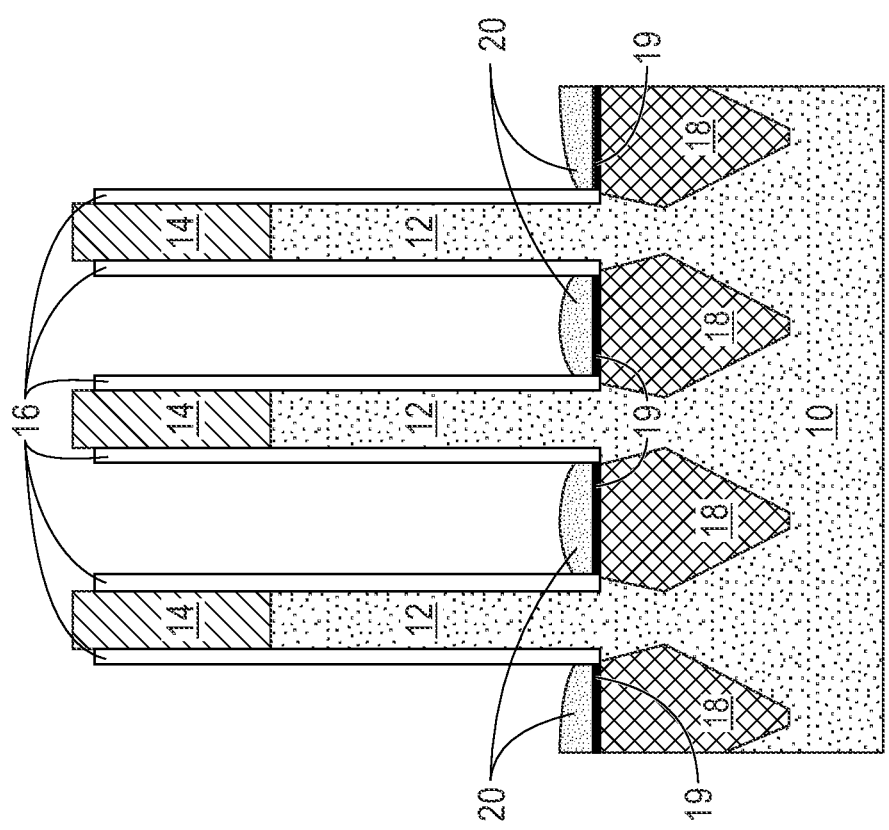
FIG. 3B is a cross sectional view of the exemplary structure of FIG. 2B after forming an optional semiconductor layer on each bottom source/drain region and forming a replacement bottom spacer on the semiconductor layer.

Referring now to FIGS. 3A-3B, there are shown the exemplary structure of FIGS. 2A-2B, respectively, after forming an optional semiconductor layer 19 on each bottom source/drain region 18 and forming a replacement bottom spacer 20 on the semiconductor layer 19. The semiconductor layer 19 is typically used in embodiments in which the replacement bottom spacer 20 (to be subsequently formed) is composed of a semiconductor material that has a same etch selectivity as the semiconductor material that provides each bottom source/drain region 18. In some embodiments, the semiconductor layer 19 is omitted, and the replacement bottom spacer 20 is formed directly on each bottom source/drain region 18. The semiconductor layer 19 is typically omitted in embodiments in which the replacement bottom spacer 20 is composed of a metal.

When present, the semiconductor layer 19 is composed of one of the semiconductor materials as mentioned above for substrate 10. The semiconductor material that provides the semiconductor layer 19 is compositionally different from the semiconductor material that provides the bottom source/drain regions 18. In one example, and when the bottom source/drain regions are composed of a silicon germanium alloy, the semiconductor layer 19 is composed of a silicon. The semiconductor layer 19 can be formed by an epitaxial growth process. Since an epitaxial growth process is used in forming the semiconductor layer 19, the semiconductor layer 19 is only formed on the physically exposed semiconductor material surface of each bottom source/drain region 18; the semiconductor layer 19 does not form on a sidewall or topmost surface of each semiconductor fin 12 since those portions of the semiconductor fin 12 are protected by the sacrificial spacer 16 and the sacrificial hard mask cap 14, respectively. When present, the semiconductor layer 19 typically has a thickness from 1 nm to 10 nm. The semiconductor 19 has a planar topmost surface as shown in FIGS. 3A-3B of the present application.

In some embodiments, the replacement bottom spacer 20 can be composed of a semiconductor material that can be selectively removed as compared to the semiconductor material that provides the semiconductor layer 19, if present, or, if the optional semiconductor layer 19 is not present, the bottom source/drain regions 18. The semiconductor material 20 that provides the replacement spacer 20 can include one of the semiconductor materials mentioned above for substrate 10. The semiconductor material that provides the replacement bottom spacer 20 is typically a non-doped semiconductor material. In one example, and when the bottom source/drain regions 18 are composed of a silicon germanium alloy and the semiconductor layer 19 is composed of a silicon, the replacement bottom spacer 20 is composed of a silicon germanium alloy. In embodiments in which the replacement bottom spacer 20 is composed of a semiconductor material, the replacement bottom spacer 20 can be formed by an epitaxial growth process. Since an epitaxial growth process is used in forming the replacement bottom spacer 20, the replacement bottom spacer 20 is only formed on a physically exposed semiconductor material surface (e.g. the semiconductor layer 19 or each bottom source/drain region 18); the replacement bottom spacer 20 does not form on a sidewall or topmost surface of each semiconductor fin 12 since those portions of the semiconductor fins 12 are protected by the sacrificial spacer 16 and the sacrificial hard mask cap 14, respectively.

In other embodiments, the replacement bottom spacer 20 is composed of a metal such as, for example, titanium or tantalum, that can be selectively removed in a subsequent processing steps as compared to the bottom source/drain regions 18. This embodiment of the present application does not typically require the formation of the semiconductor layer 19; however, the semiconductor layer 19 can be formed if so desired utilizing a metal as the material for the bottom replacement spacer 20. In this embodiment, the bottom replacement spacer 20 can be formed by a selective deposition process such as, for example, area selective CVD process.

The replacement bottom spacer 20 is moon-shaped. By "moon-shaped" it is meant that the replacement bottom spacer 20 has upper surface that is convex, i.e., the upper surface of the replacement bottom spacer 20 is curved or rounded outward like the exterior of a sphere or circle. The bottommost surface of the replacement bottom spacer 20 is planar.

Referring now to FIGS. 4A-4B, there are shown the exemplary structure of FIGS. 3A-3B, respectively, after forming a dielectric spacer 22 laterally adjacent to the sacrificial dielectric spacer 16, forming a patterned mask, PM, covering at least one active device region, and forming a trench 23 into a portion of the substrate 10. The term "active device region" denotes a region of the structure in which at least one n-type or p-type semiconductor device (e.g., VTFET) is to be formed. The trench 23 that is formed surrounds, and is located at an edge of, the active device region that contains the least one n-type or p-type semiconductor device (e.g., VTFET). Another active device region can be located laterally adjacent to the device region containing the least one n-type or p-type semiconductor device (e.g., VTFET). In FIG. 4A, the left hand side of the drawing includes a first active device region including two semiconductor fins 12, and the right hand side of the same drawing denotes a second active device region including a single semiconductor fin 12. These two active device regions are separated by trench 23. The number of semiconductor fins 12 in the different device regions can vary and is not limited to the number illustrated in the drawings of the present application.

The dielectric spacer 22 can be composed a dielectric spacer material such as, for example, silicon oxide, silicon nitride, or silicon oxynitride. The dielectric spacer material that provides the dielectric spacer 22 is typically compositionally different from the dielectric spacer material that provides the sacrificial spacer 16. The dielectric spacer 22 can be formed by first depositing the dielectric spacer material and then performing a spacer etch. Dielectric spacer 22 is pillar shaped and has a topmost surface that is typically coplanar with a topmost surface of the sacrificial spacer 16. Dielectric spacer 22 is formed on a portion, but not an entirety, of the replacement bottom spacer 20.

The patterned mask, PM, can be composed of an organic planarization layer (OPL) and it can be formed by first depositing a blanket layer of OPL, and then patterning the OPL by lithography and etching. In the illustrated embodiments, the patterned mask, PM, is formed over two semiconductor fins 12 and protects the bottom replacement spacer 20 that is located between the two protected semiconductor fins 12, the other bottom replacement spacers 20 that are not protected by the patterned mask, PM, are physically exposed.

The trench 23 is formed utilizing an etching process with the patterned mask, PM, in place. The etching process can include one or more etching steps including chemical wet etching and/or dry etching. In one embodiment, a reactive ion etch is used to form the trench 23. Although the present application describes and illustrates a single trench 23, a plurality of trenches 23 can be formed. As is shown in FIG. 4A, the trench 23 is formed between the second semiconductor fin 12 present in the active device region protected by the patterned mask, PM, and the non-protected semiconductor fin 12 in the other active device region. Note that the trench also cuts the bottom source/drain region 18 that is located between the different active device regions. Thus, a cut replacement bottom spacer 20X is formed adjacent to, and at the edge of, the trench 23 and in both the active device regions shown in FIG. 4A.

Referring now to FIGS. 5A-5B, there are shown the exemplary structure of FIGS. 4A-4B, respectively, after removing the patterned mask, PM, and forming a dielectric fill material 24 between each semiconductor fin 12 and within the trench 23. In some embodiments, the dielectric spacer 22 is also removed prior to forming the dielectric fill material 24. In other embodiments, the dielectric spacer 22 remains and forms part of the dielectric fill material 24.

The patterned mask, PM, can be removed utilizing a conventional stripping process that is selective in removing the material that provides the patterned mask, PM. If removed, the dielectric spacer 22 can be removed utilizing an etching process that is selective in removing the dielectric spacer material that provides the dielectric spacer 22. The removal of the dielectric spacer 22 does not remove the sacrificial spacer 16.

In embodiments, the dielectric fill material 24 can include one of the dielectric spacer materials mentioned above for dielectric spacer 22. The dielectric material that provides the dielectric fill material 24 can be compositionally the same as, or compositionally different from, the dielectric material that provides the dielectric spacer 22. The dielectric fill material 24 can be formed utilizing a deposition process including, for example, chemical vapor deposition (CVD), plasma enhanced chemical vapor deposition (PECVD), evaporation or spin-on coating.

Figure 6B:
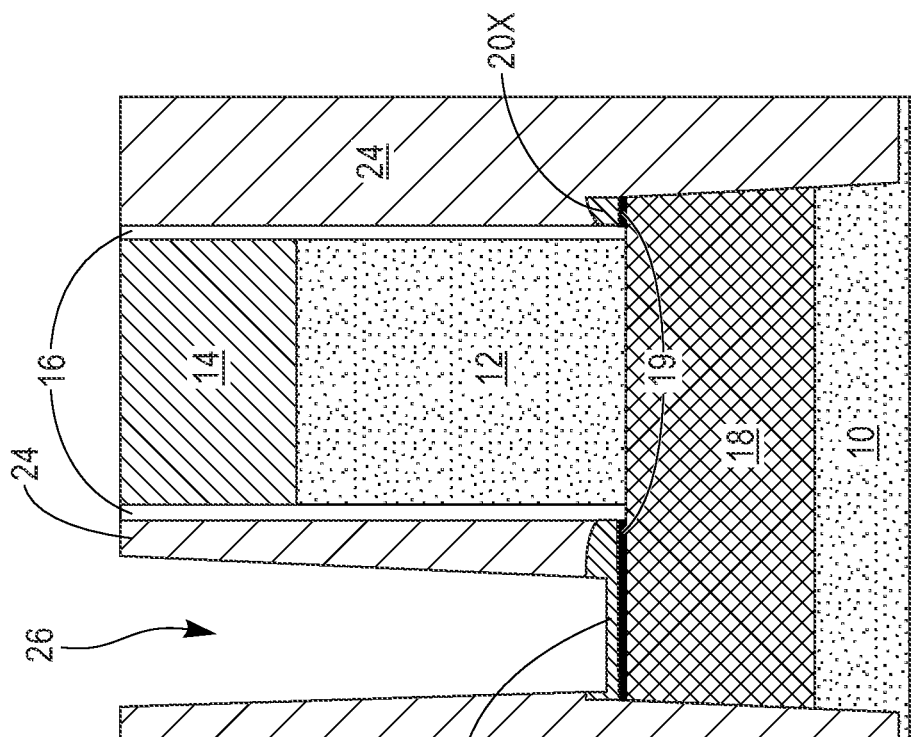
FIG. 6B is a cross sectional view of the exemplary structure of FIG. 5B after accessing at least one of replacement bottom spacers.
Figure 6A:
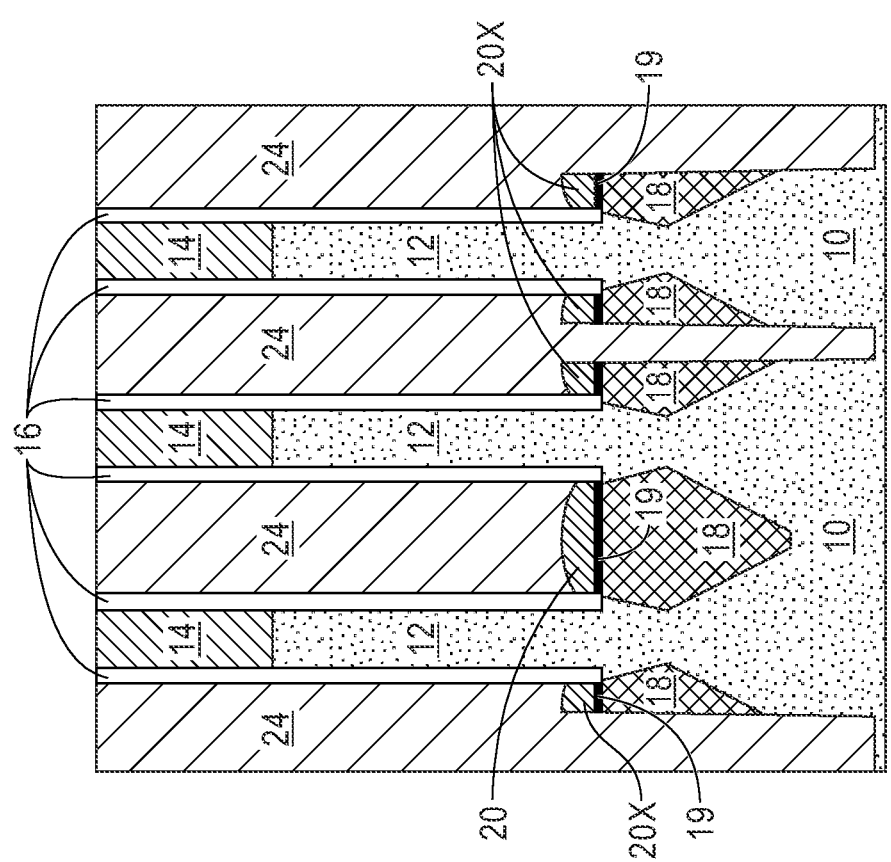
FIG. 6A is a cross sectional view of the exemplary structure of FIG. 5A after accessing at least one of replacement bottom spacers.

Referring now to FIGS. 6A-6B, there are shown the exemplary structure of FIGS. 5A-5B, respectively, after accessing at least one of replacement bottom spacers 20. In some embodiments, this accessing step can remove a portion of the accessed replacement bottom spacer to form a patterned bottom replacement spacer 20S. In other embodiments (not shown) the accessing of at least one of replacement bottom spacers 20 does not remove any portion of the accessed replacement bottom spacer 20.

The accessing of the least one of replacement bottom spacers 20 includes forming another patterned mask (not shown) over the exemplary structure including dielectric fill material 24, then forming an opening 26 into the dielectric fill material 24 which physically exposes one of the replacement bottom spacers 20, and thereafter removing a portion of the physical exposed replacement bottom spacer 20. The opening can be formed by utilizing a first etch that is selective in removing the dielectric fill material 24, and the removing a portion of the physically exposed replacement bottom spacer 20 can include a second etch that is selective in removing a portion of the bottom replacement spacer 20 to provide patterned bottom replacement spacer 20S.

Figure 7A:
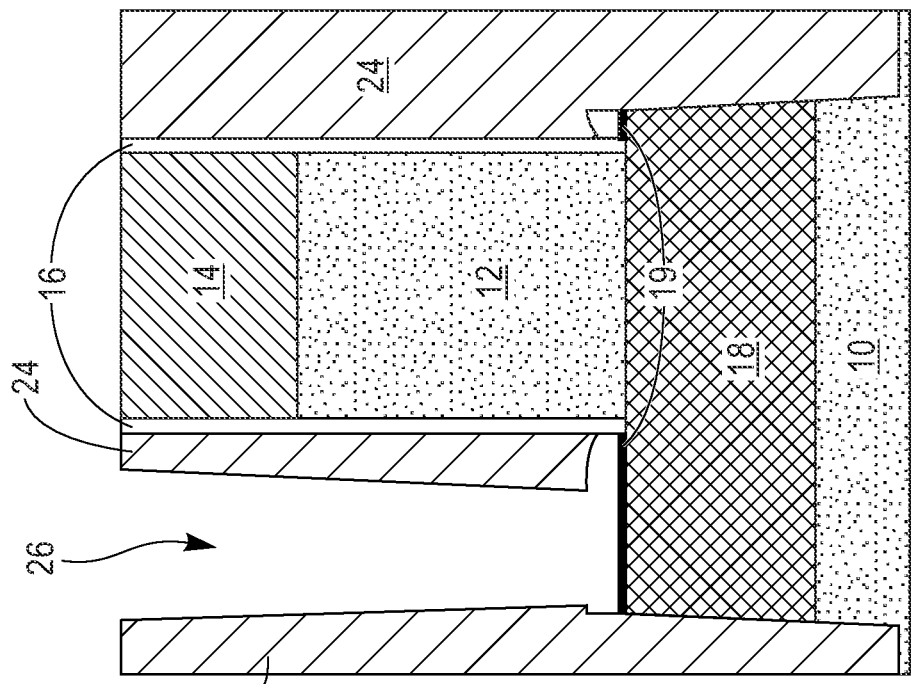
FIG. 7A is a cross sectional view of the exemplary structure of FIG. 6A after selectively removing each replacement bottom spacer to provide a void.
Figure 7B:
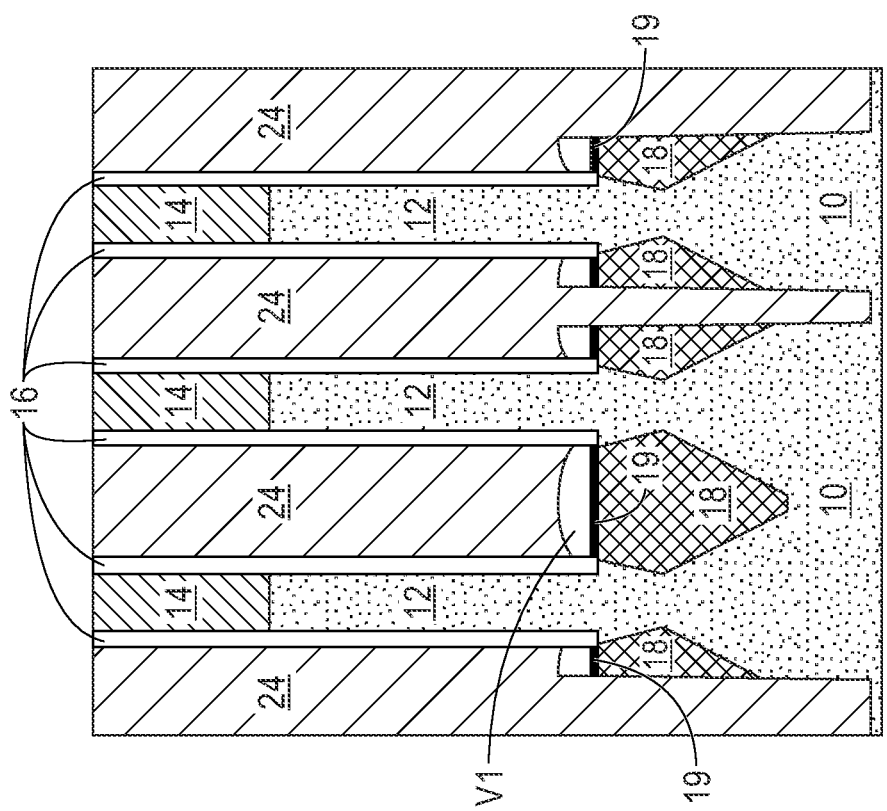
FIG. 7B is a cross sectional view of the exemplary structure of FIG. 6B after selectively removing each replacement bottom spacer to provide a void.

Referring now to FIGS. 7A-7B, there are shown the exemplary structure of FIGS. 6A-6B, respectively, after selectively removing each replacement bottom spacer 20, including the cut replacement bottom spacers 20X, and the at least one patterned replacement bottom spacer 20S to provide a void, V1, in each area previously including replacement bottom spacers 20, cut replacement bottom spacers 20X, and patterned replacement bottom spacer 20. This removal step includes an etch process that is selective in removing the material that provides each replacement bottom spacer 20. For example, and when SiGe is used as the material of each replace bottom spacer 20, vapor phased HCl can be used to the removing each replacement bottom spacer 20, including the cut replacement bottom spacers 20X, and the at least one patterned replacement bottom spacer 20S to provide a void, V1; the voids have the volume of the removed replacement bottom spacer 20, the cut replacement bottom spacers 20X, and if present, the patterned replacement bottom spacer 20S. As is shown in FIGS. 7A-7B, a void, V1, is formed above each bottom source/drain region 18.

Figure 8A:
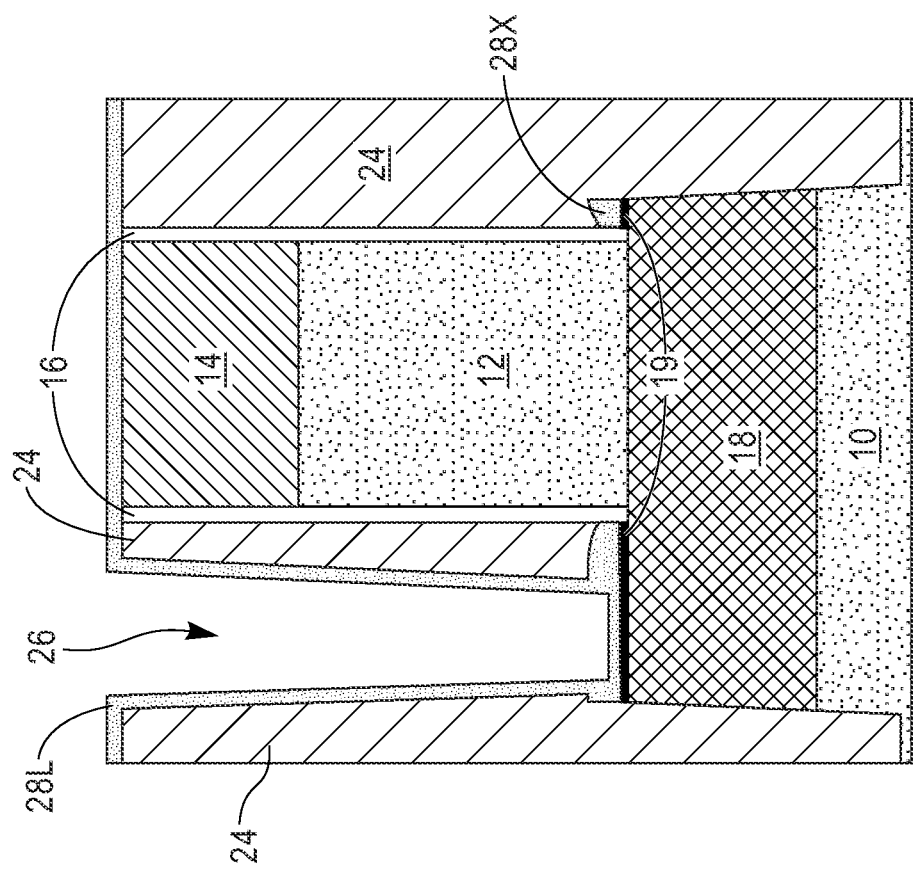
FIG. 8A is a cross sectional view of the exemplary structure of FIG. 7A after forming a spacer dielectric liner on a topmost surface of the exemplary structure and within each void.
Figure 8B:
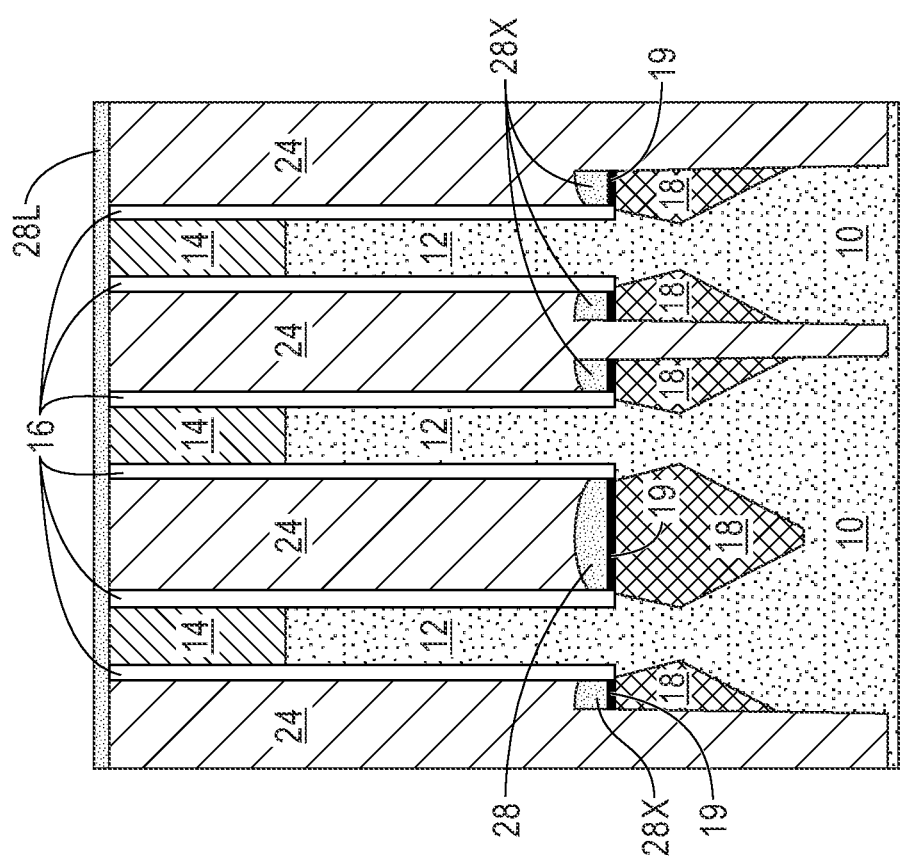
FIG. 8B is a cross sectional view of the exemplary structure of FIG. 7B after forming a spacer dielectric liner on a topmost surface of the exemplary structure and within each void.

Referring now to FIGS. 8A-8B, there are shown the exemplary structure of FIGS. 7A-7B, respectively, after forming a conformal spacer dielectric liner 28L on a topmost surface of the exemplary structure and within each void, V1; the volume of each void is entirely filled with the spacer dielectric liner 28L.

The spacer dielectric liner 28L is composed of a dielectric spacer material that is compositionally different from the dielectric spacer material that provides the sacrificial spacer 16 and the dielectric material that provides the dielectric fill material 24. The dielectric spacer material that provides the spacer dielectric liner 28L can be composed of a dielectric material having a dielectric contact of less than 7.0. In one embodiment, the dielectric spacer material that provides the spacer dielectric liner 28L is composed of atoms of Si, C and O (i.e., SiCO dielectric), atoms of Si, B, C and N (i.e., SiBCN dielectric), or atoms of Si and C (i.e., SiC dielectric). The spacer dielectric liner 28L can be formed utilizing a conformal deposition process such as, for example, CVD, PECVD, PVD, or atomic layer deposition (ALD).

Referring now to FIGS. 9A-9B, there are shown the exemplary structure of FIGS. 8A-8B, respectively, after performing a spacer dielectric etch back process to provide a bottom spacer that is moon-shaped in each of the voids. Notably, moon-shaped bottom spacers 28 are formed in the active device area that was previously protected by patterned mask, PM, and cut moon-shaped bottom spacers 28X are formed in the areas located next to trench 23. The cut moon-shaped spacer 28X have a dimension that is less than a dimension of each moon-shaped spacer 28. The moon-shaped and cut moon shaped spacers are formed atop a bottom source/drain region 18. The spacer dielectric etch back process removes the spacer dielectric liner from the topmost surface of each of the dielectric fill material 24, the sacrificial spacer 16, and the sacrificial hard mask caps 14, and from the sidewalls of the opening 26, while maintaining the spacer dielectric liner 28L in each void, V1. The maintained the spacer dielectric liner 28L in each void, V provides the moon-shaped bottom spacers 28 and cut moon-shaped bottom spacers 28X mentioned above. The moon-shaped bottom spacers 28 and cut moon-shaped bottom spacers 28X have an upper surface that is convex and a bottommost surface that is planar. The moon-shaped bottom spacers 28 and cut moon-shaped bottom spacers 28X have a uniform thickness, because the dimension of the moon-shaped bottom spacer is defined by the epitaxy growth process, which is very uniform and accurate across the wafer, compared to directional dielectric deposition techniques which could largely depend on pattern density and sensitive to FIN pitch-walking or critical dimension (CD) non-uniformity.

Figure 10B:
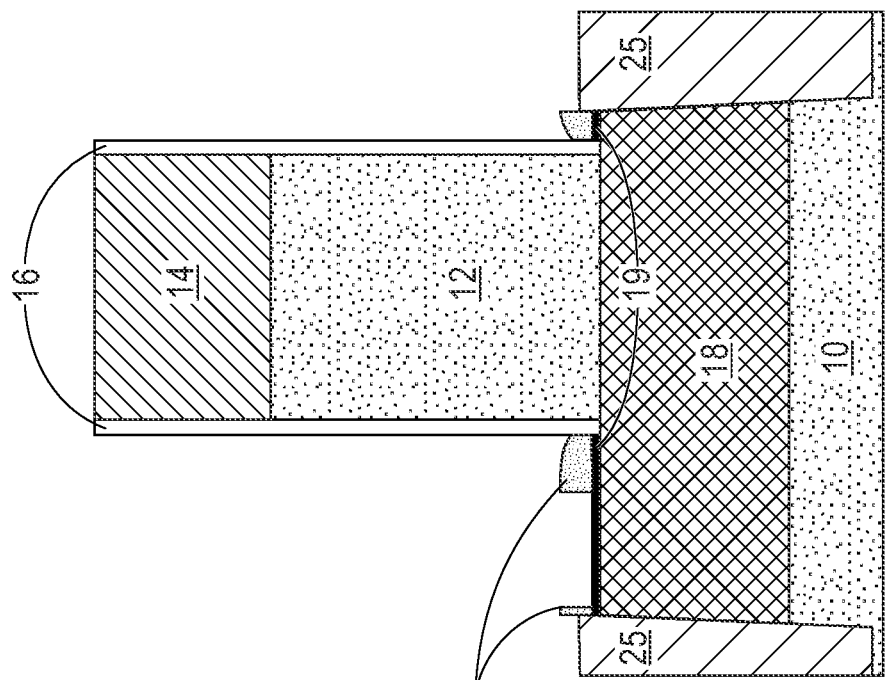
FIG. 10B is a cross sectional view of the exemplary structure of FIG. 9B after removing the dielectric fill material between each semiconductor fin.
Figure 10A:
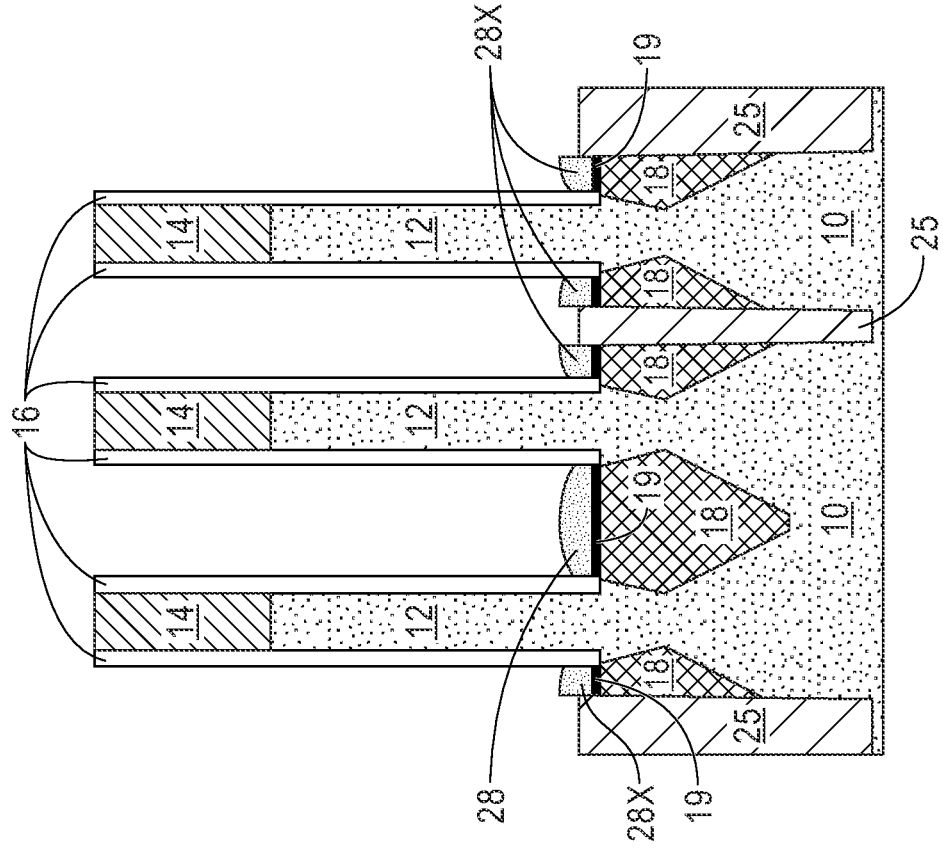
FIG. 10A is a cross sectional view of the exemplary structure of FIG. 9A after removing the dielectric fill material between each semiconductor fin.

Referring now to FIGS. 10A-10B, there are shown the exemplary structure of FIGS. 9A-9B, respectively, after removing the dielectric fill material 24 between each semiconductor fin 12, while maintaining dielectric fill material 24 with each trench to provide a trench isolation structurer 25 that separates each active device region from one another. In some embodiments, the entirety of the dielectric fill material 24 is removed and then a trench dielectric material such as, for example, silicon oxide, is formed into the trench to provide the trench isolation structure 25. The dielectric fill material 24 can be removed utilizing a material removal process that is selective in removing the dielectric fill material 24. In one example, a reactive in etch can be used to remove the dielectric fill material 24.

As is shown in FIGS. 10A and 10B, the trench isolation structure 25 can have a topmost surface that extends above a topmost surface of substrate 10. In some embodiments (not shown), the trench isolation structure 25 can have a topmost surface that is coplanar with a topmost surface of the substrate 10.

Referring now to FIGS. 11A-11B, there are shown the exemplary structure of FIGS. 10A-10B, respectively, after forming a functional gate structure 30, a top spacer 32, a top source/drain region 34, an interlayer dielectric (ILD) material layer 36, and contact structures 38, 40, and 42. Contact structure 38 physically contacts the top source/drain region 24 and thus can be referred to as a top source/drain contact structure. Contact structure 40 physically contacts the bottom source/drain region 18 and thus can be referred to as a bottom source/drain contact structure. Contact structure 42 physically contacts a gate electrode of the functional gate structure 30 and thus can be referred to a gate contact structure.

Prior to forming the functional gate structure 30, the top spacer 32, the top source/drain region 34, the interlayer dielectric (ILD) material layer 36, and the contact structures 38, 40, and 42, the sacrificial spacer 16 is at least partially removed from the sidewall of each semiconductor fin 12. A portion of the sacrificial spacer 16 can remain between a lower portion of each semiconductor fin 12 and the moon-shaped bottom spacer 28 or cut moon-shaped bottom spacer 28X. The remaining portion of the sacrificial spacer 16 can be referred to a sacrificial spacer portion 16P. The sacrificial spacer 16 can be removed utilizing an etching process that is selective for removing the spacer dielectric material that provides the sacrificial spacer 16.

A sidewall of each semiconductor fin 12 is now exposed and the functional gate structure 30 can be formed to wrap around the exposed sidewall of each semiconductor fin 12. The functional gate structure 30 includes at least a gate dielectric material layer and a gate electrode; both of which are not individually shown in the drawings of the present application. The gate dielectric material layer is present along the sidewall of each semiconductor fin 12 and a bottom wall of the gate electrode. In some embodiments, the functional gate structure 30 includes a work function metal (WFM) layer located between the gate dielectric material layer and the gate electrode.

The formation of the functional gate structure 30 includes forming a continuous layer of gate dielectric material laterally adjacent to the sidewall of each semiconductor fin 12 and above the bottom source/drain regions 18, and then forming a gate electrode laterally adjacent to and above the gate dielectric material. The continuous layer of gate dielectric material can include silicon oxide, or a dielectric material having a dielectric constant greater than 4.0 (such dielectric materials can be referred to as a high-k gate dielectric material). All dielectric constants mentioned herein are measured in a vacuum unless otherwise is noted. Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to, tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof.

In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process as mentioned above. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a patterning process can be used to provide the functional gate structure 30. The continuous layer of the gate dielectric material can be referred to as a gate dielectric material layer, the remaining optional layer of WFM can be referred to a WFM layer, and remaining gate electrode material that is present inside the gate cavity provides a gate electrode. In some embodiments, block mask technology can be implemented to form functional gate structures 30 that are tailored for the specific active device region, i.e., NFET device region or PFET device region.

After forming the functional gate structure 30, each sacrificial hard mask cap 14 is removed and a top spacer is formed on the functional gate structure 30 and along an upper portion of the sidewall of each semiconductor fin 12. Typically, the sacrificial hard mask caps 14 is removed prior to forming the top spacer 32.

The removal of the sacrificial hard mask cap 14 can include any material removal process that is selective in removing each sacrificial hard mask cap 14 from the semiconductor fins 12. In one example, the sacrificial hard mask cap 14 can be removed utilizing a selective wet etching process such as, for example, a diluted HF+HCl solution or hot phosphorus. The removal of each sacrificial hard mask cap 14 physically exposes a topmost surface of an underlying semiconductor fin 12.

The top spacer layer 32 can be composed of a dielectric spacer silicon dioxide, silicon nitride, silicon oxynitride or a low k dielectric material (i.e., a dielectric material having a dielectric constant that is less than the dielectric constant of 4.0, all dielectric constants mentioned herein as measured in a vacuum). An example of a low k dielectric material that can be used as the top spacer includes a dielectric material including atoms of silicon, boron, carbon and nitrogen. The top spacer 32 can be compositionally the same as, or compositionally different from, the moon-shaped bottom spacer 28 or the cut moon-shaped bottom spacer 28X.

The top spacer 32 can be formed utilizing a deposition process such as, for example, CVD or PECVD. The top spacer 32 can have a thickness from 5 nm to 15 nm. Other thicknesses that are lesser than, or greater than, the aforementioned thickness range can also be employed in the present application as the thickness of the top spacer 32 as long as the height of the top spacer 32 does not extend above the topmost surface of the semiconductor fins 12. The top spacer 32 has a sidewall that directly contacts the upper portion of the physically exposed sidewall of each of the semiconductor fins 12. In some embodiments, the top spacer 32 has a topmost surface that is coplanar with a topmost surface of each of the semiconductor fins 12.

After top spacer 32 formation, a top source/drain region 34 is epitaxially grown from a physically exposed topmost surface of each semiconductor fin 12. The dopants within the top source/drain region 34 are typically introduced during the epitaxial growth process. In some embodiments block mask technology can be implemented to form different top source/drain regions 34 in each of the device regions.

The top source/drain regions 34 includes one of the semiconductor materials mentioned above for the substrate 10 and an n-type dopant or p-type dopant (as defined above). The semiconductor material that provides the top source/drain regions 34 can be compositionally the same as, or compositionally different from, the semiconductor material that provides the bottom source/drain structures 18 and/or the semiconductor fins 12. The concentration of dopant within the semiconductor material that provides the semiconductor fins 12 be in the range mentioned above for the bottom source/drain structures 18. In some embodiments (not shown), the top source/drain regions 34 can have a faceted surface. In other embodiments (and as shown in FIGS. 11A and 11B), the top source/drain regions 34 have a planar topmost surface.

In some embodiments (not shown), a V-shaped groove can be formed in a topmost surface of each of the semiconductor fins 12 prior to forming the top source/drain regions 34. The V-shaped groove has a shape of an inverted triangle in which the tip of the inverted triangle extends downward into each semiconductor fin 12. The tip of the inverted triangle that defines the V-shaped groove can extend to a level that is equal to, or beneath, a topmost surface of the functional gate structure 30. The forming of the V-shaped groove in a topmost surface of each of the semiconductor fins 12 includes a crystallographic etching process. The crystallographic etching process can include contacting the topmost surface of the semiconductor fins 12 with a chemical etchant. In one example, and when the semiconductor fins 12 are composed of silicon, the chemical etchant can be potassium hydroxide (KOH) or tetramethyl ammonium hydroxide (TMAH). In this embodiment, the top source/drain region is grown in and upwards from the V-shaped groove.

Interlayer dielectric (ILD) material layer 36 is formed after the formation of the top source/drain regions 34. The ILD material layer 36 is composed of a dielectric material such as, for example, silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD material layer 36. In one embodiment, ILD material layer 36 can be formed utilizing a deposition process including, for example, CVD, PECVD, evaporation or spin-on coating. Following deposition of the ILD material layer 36 a planarization process such as, for example, chemical mechanical polishing (CMP), can employed.

Contact openings (not shown) are then formed into ILD material layer 36. The contact openings can be formed by lithography and etching. Contact openings are formed that extend down to the bottom source/drain regions, the top source/drain regions and the functional gate structures.

In some embodiments (not shown), a metal semiconductor alloy region can be formed in each of the contact openings that extend to the bottom source/drain regions 18 and/or the top source/drain regions 34. The metal semiconductor alloy region can be composed of a silicide or germicide. In one or more embodiments of the present application, the metal semiconductor alloy region can be formed by first depositing a metal layer (not shown) in each of the contact openings that extend to the bottom source/drain regions 18 and/or the top source/drain regions 38. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the bottom source/drain region 18 and/or the top source/drain region 34 to provide the metal semiconductor alloy regions. The unreacted portion of the metal layer, and, if present, the diffusion barrier, then removed, for example, by an etch process (or a plurality of etching processes). In one embodiment, the etching process can be a wet etch that removes the metal in the metal layer selective to the metal semiconductor alloy in the metal semiconductor alloy regions. A contact metal is then deposited in the contact openings that extend to the bottom source/drain regions 18 and/or the top source/drain regions 34 to form the bottom source/drain contact structure 40 and top source/drain contact structure 38.

The bottom and top source/drain contact structures 40 and 38 can include one or more source/drain contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

A contact conductor material is subsequently deposited into each of the contact openings that extend to the bottom source/drain regions 18 and the top source/drain regions 34 to completely fill a remaining volume of those contact openings. The contact conductor material can include a metal such as, for example, W, Cu, Al, Co, Ru, Mo, Os, Ir, Rh or an alloy thereof. The contact conductor layer can be formed by any suitable deposition method such as, for example, ALD, CVD, PVD or plating. A planarization process can be used to remove the contact conductor material and the contact liner (when provided) that are located outside the contact openings that extend to the bottom source/drain regions 18 and the top source/drain regions 34. The remaining contact conductor material and if present, the contact liner and the metal semiconductor alloy region provide bottom source/drain contact structure 40 and the top source/drain contact structure 38.

Contact openings that extend to the functional gate structures 40 can be processed in a manner similar to that used in forming the bottom and top source/drain contact structures 40, 38 with the exception that no metal semiconductor alloy region is typically formed in Contact openings that extend to the functional gate structures. As a result of such processing, a gate contact structure 42 is formed that contacts the functional gate structure 30. Gate contact structure 42 includes a remaining portion of a contact conductor material and if present, a remaining portion of the contact liner. The gate contact structure 42 can include a contact conductor material that is compositionally the same as, or compositionally different from, the contact conductor material that provides the bottom and top source/drain contact structures 40, 38. Also, the gate contact structure 42 can include a contact liner that is compositionally the same as, or compositionally different from, the contact liner that provides the bottom and top source/drain contact structures 40, 38. As is shown, the bottom source/drain contact structure 40 has at topmost surface that is coplanar with a topmost surface of each of the top source/drain contact structure 38, the gate contact structure 42 and the ILD material layer 36.

The terminology used herein is for the purpose of describing particular embodiments only and is not intended to be limiting of the present application. As used herein, the singular forms "a", "an" and "the" are intended to include the plural forms as well, unless the context clearly indicates otherwise. It will be further understood that the terms "comprises" and/or "comprising", when used in this application, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A vertical transport field effect transistor (VTFET) device comprising:
   at least one semiconductor fin extending upward from a surface of a substrate and located in a first active device region, wherein a trench isolation structure is located in the substrate and at an edge of the first active device region;
   a bottom source/drain region located beneath, and on each side of, the at least one semiconductor fin;
   a moon-shaped bottom spacer located laterally adjacent to a lower portion of at least a first side of the at least one semiconductor fin and above the bottom source/drain region, wherein the moon-shaped bottom spacer has a convex upper surface and a planar bottommost surface;
   a functional gate structure contacting a middle portion of the at least one semiconductor fin and located on the convex upper surface of the moon-shaped bottom spacer;
   a top spacer contacting an upper portion of the at least one semiconductor fin and on a surface of the functional gate structure; and
   a top source/drain region contacting an upper surface of the at least one semiconductor fin.

2. The VTFET device of claim 1, further comprising a cut moon-shaped spacer located laterally adjacent to the lower portion of a second side of the at least one semiconductor fin and located in the first active device region and at an edge of the trench isolation structure.

3. The VTFET device of claim 1, further comprising a bottom source/drain contact structure contacting the bottom source/drain region, a top source/drain contact structure contacting the top source/drain region and a gate contact structure contacting the functional gate structure.

4. The VTFET device of claim 3, wherein each of the bottom source/drain contact structure, the top source/drain contact structure, and the gate contact structure is embedded in an interlayer dielectric (ILD) material layer.

5. The VTFET device of claim 4, wherein the bottom source/drain contact structure has a topmost surface that is coplanar with a topmost surface of each of the top source/drain contact structure, the gate contact structure and the ILD material layer.

6. The VTFET device of claim 1, wherein the moon-shaped bottom spacer is composed of a dielectric material having a dielectric constant of less than 7.0.

7. The VTFET device of claim 6, wherein the moon-shaped bottom spacer is composed of a dielectric material containing atoms of Si, C and 0, a dielectric material containing atoms of Si, B, C and N, or a dielectric material containing atoms of Si and C.

8. The VTFET device of claim 1, wherein the substrate is a semiconductor material.

9. The VTFET device of claim 1, wherein the functional gate structure includes at least a gate dielectric material and a gate electrode, wherein the gate dielectric material physically contacts the middle portion of the at least one semiconductor fin.

10. The VTFET device of claim 1, wherein the moon-shaped bottom spacer is located directly on a surface of the bottom source/drain region.

11. The VTFET device of claim 1, wherein the moon-shaped bottom spacer is spaced apart from the bottom source/drain region by a semiconductor layer.

12. The VTFET device of claim 1, further comprising a second active device region located laterally adjacent to the first active device region, wherein the first and second active device regions are isolated by the trench isolation structure.

13. The VTFET device of claim 12, wherein the second active device region comprises at least one other semiconductor fin extending upward from the substrate, another bottom source/drain region located beneath, and on each side of, the at least one other semiconductor fin, another moon-shaped bottom spacer located laterally adjacent to a lower portion of at least a first side of the at least one other semiconductor fin and on a surface of the another bottom source/drain region, another functional gate structure contacting a middle portion of the at least one other semiconductor fin and located above the another moon-shaped bottom spacer, and another top spacer contacting an upper portion of the at least one other semiconductor fin and on a surface of the another functional gate structure, and another top source/drain region contacting an upper surface of the at least one other semiconductor fin.

14. A vertical transport field effect transistor (VTFET) device comprising:
- at least one semiconductor fin extending upward from a surface of a substrate and located in a first active device region, wherein a trench isolation structure is located in the substrate and at an edge of the first active device region;
- a bottom source/drain region located beneath, and on each side of, the at least one semiconductor fin;
- a moon-shaped bottom spacer located laterally adjacent to a lower portion of at least a first side of the at least one semiconductor fin and above the bottom source/drain region, wherein the moon-shaped bottom spacer has a convex first surface and a planar second surface, opposite the convex first surface;
- a functional gate structure contacting a middle portion of the at least one semiconductor fin and located directly on the convex first surface of the moon-shaped bottom spacer;
- a top spacer contacting an upper portion of the at least one semiconductor fin and on a surface of the functional gate structure; and
- a top source/drain region contacting an upper surface of the at least one semiconductor fin.

* * * * *